(12) United States Patent
Liu et al.

(10) Patent No.: US 9,190,265 B2
(45) Date of Patent: *Nov. 17, 2015

(54) MEMORY DEVICES AND FORMATION METHODS

(71) Applicant: Micron Technology, Inc., Boise, ID (US)

(72) Inventors: Jun Liu, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/247,653

(22) Filed: Apr. 8, 2014

(65) Prior Publication Data

US 2014/0220763 A1 Aug. 7, 2014

Related U.S. Application Data

(60) Continuation of application No. 13/888,674, filed on May 7, 2013, now Pat. No. 8,729,520, which is a continuation of application No. 13/442,047, filed on Apr. 9, 2012, now Pat. No. 8,455,853, which is a (Continued)

(51) Int. Cl.
*H01L 21/8239* (2006.01)
*H01L 21/02* (2006.01)
(Continued)

(52) U.S. Cl.
CPC ...... *H01L 21/02225* (2013.01); *H01L 27/2409* (2013.01); *H01L 27/2472* (2013.01);
(Continued)

(58) Field of Classification Search
CPC ............ H01L 21/02225; H01L 27/2409; H01L 27/2472; H01L 27/2481; H01L 45/06; H01L 45/12; H01L 45/16; H01L 45/1233; H01L 45/144

USPC .......... 438/237, 455, 459; 257/379, E21.123, 257/E21.645, E27.033

See application file for complete search history.

(56) References Cited

U.S. PATENT DOCUMENTS 3,765,081 A 10/1973 Beck
5,183,769 A 2/1993 Rutter et al.
(Continued)

FOREIGN PATENT DOCUMENTS

CN 200980143003 10/2012
JP 2001-189419 7/2007
(Continued)

OTHER PUBLICATIONS

A.J. Auberton-Herve, "SOI: Materials to Systems" Int'l. Elec. Dev. Mtg., Dec. 8-11, 1996, pp. 3-10.
(Continued)

*Primary Examiner* — Mary Wilczewski
(74) *Attorney, Agent, or Firm* — Wells St. John, P.S.

(57) ABSTRACT

A method includes forming an electrical insulator material over an integrated circuit having a metal-containing conductive interconnect and activating a dopant in a semiconductor material of a substrate to provide a doped region. The doped region provides a junction of opposite conductivity types. After activating the dopant, the substrate is bonded to the insulator material and at least some of the substrate is removed where bonded to the insulator material. After the removing, a memory cell is formed having a word line, an access diode, a state-changeable memory element containing chalcogenide phase change material, and a bit line all electrically connected in series, the access diode containing the junction as a p-n junction. A memory device includes an adhesion material over the insulator material and bonding the word line to the insulator material.

17 Claims, 7 Drawing Sheets

Related U.S. Application Data continuation of application No. 12/952,047, filed on Nov. 22, 2010, now Pat. No. 8,164,081, which is a division of application No. 12/261,948, filed on Oct. 30, 2008, now Pat. No. 7,858,468.

(51) Int. Cl.
  *H01L 27/24* (2006.01)
  *H01L 45/00* (2006.01)

(52) U.S. Cl.
  CPC ............ *H01L27/2481* (2013.01); *H01L 45/06* (2013.01); *H01L 45/12* (2013.01); *H01L 45/1233* (2013.01); *H01L 45/144* (2013.01); *H01L 45/16* (2013.01)

(56) References Cited

U.S. PATENT DOCUMENTS

| | | |
|---|---|---|
| 5,374,582 A | 12/1994 | Okonogi et al. |
| 5,424,235 A | 6/1995 | Nishihara |
| 5,661,063 A | 8/1997 | Lee |
| 5,915,167 A | 6/1999 | Leedy |
| 6,093,623 A | 7/2000 | Forbes |
| 6,133,640 A | 10/2000 | Leedy |
| 6,153,495 A | 11/2000 | Kub et al. |
| 6,208,545 B1 | 3/2001 | Leedy |
| 6,297,090 B1 | 10/2001 | Kim |
| 6,384,422 B2 | 5/2002 | Shimoji |
| 6,551,857 B2 | 4/2003 | Leedy |
| 6,563,133 B1 | 5/2003 | Tong |
| 6,563,224 B2 | 5/2003 | Leedy |
| 6,593,184 B2 | 7/2003 | Han |
| 6,632,706 B1 | 10/2003 | Leedy |
| 6,787,825 B1 | 9/2004 | Gudesen et al. |
| 6,815,077 B1 | 11/2004 | Herner et al. |
| 6,939,763 B2 | 9/2005 | Schlosser et al. |
| 7,002,197 B2 | 2/2006 | Perner et al. |
| 7,052,924 B2 * | 5/2006 | Daniels et al. ................. 438/22 |
| 7,138,295 B2 | 11/2006 | Leedy |
| 7,193,239 B2 | 3/2007 | Leedy |
| 7,208,751 B2 | 4/2007 | Ooishi |
| 7,283,383 B2 | 10/2007 | Kang |
| 7,285,464 B2 | 10/2007 | Herner et al. |
| 7,345,898 B2 * | 3/2008 | Park et al. ................. 365/63 |
| 7,351,992 B2 | 4/2008 | Scheuerlein |
| 7,436,692 B2 | 10/2008 | Pellizzer et al. |
| 7,442,602 B2 | 10/2008 | Park et al. |
| 7,474,004 B2 | 1/2009 | Leedy |
| 7,504,732 B2 | 3/2009 | Leedy |
| 7,511,297 B2 | 3/2009 | Jang et al. |
| 7,515,460 B2 | 4/2009 | Gordon et al. |
| 7,541,252 B2 | 6/2009 | Eun et al. |
| 7,612,360 B2 | 11/2009 | Lee et al. |
| 7,613,037 B2 | 11/2009 | Kim et al. |
| 7,696,508 B2 | 4/2010 | Song et al. |
| 7,704,788 B2 | 4/2010 | Youn et al. |
| 7,705,466 B2 | 4/2010 | Leedy |
| 7,858,468 B2 | 12/2010 | Liu et al. |
| 8,035,233 B2 | 10/2011 | Leedy |
| 8,164,081 B2 | 4/2012 | Liu et al. |
| 8,288,206 B2 | 10/2012 | Leedy |
| 8,318,538 B2 | 11/2012 | Leedy |
| 8,455,853 B2 * | 6/2013 | Liu et al. ................. 257/2 |
| 8,729,520 B2 * | 5/2014 | Liu et al. ................. 257/2 |
| 2001/0033030 A1 | 10/2001 | Leedy |
| 2002/0132465 A1 | 9/2002 | Leedy |
| 2002/0135075 A1 | 9/2002 | Leedy |
| 2003/0057564 A1 | 3/2003 | Leedy |
| 2003/0173608 A1 | 9/2003 | Leedy |
| 2004/0070063 A1 | 4/2004 | Leedy |
| 2004/0097008 A1 | 5/2004 | Leedy |
| 2004/0132231 A1 | 7/2004 | Leedy |
| 2004/0151043 A1 | 8/2004 | Leedy |
| 2005/0112846 A1 | 5/2005 | Meyer et al. |
| 2005/0280061 A1 | 12/2005 | Lee |
| 2005/0280155 A1 | 12/2005 | Lee |
| 2005/0286287 A1 * | 12/2005 | Park et al. ................. 365/63 |
| 2006/0051911 A1 | 3/2006 | Gu et al. |
| 2006/0108627 A1 | 5/2006 | Choi et al. |
| 2007/0132049 A1 | 6/2007 | Stipe |
| 2007/0161162 A1 | 7/2007 | Jeng |
| 2007/0246764 A1 | 10/2007 | Herner |
| 2008/0061419 A1 | 3/2008 | Enquist et al. |
| 2009/0004826 A1 | 1/2009 | Kim et al. |
| 2009/0026524 A1 | 1/2009 | Kreupl et al. |
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219772 A1 | 9/2009 | Leedy |
| 2009/0230501 A1 | 9/2009 | Leedy |
| 2010/0038743 A1 | 2/2010 | Lee |
| 2010/0108970 A1 | 5/2010 | Liu et al. |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2010/0207168 A1 | 8/2010 | Sills et al. |
| 2011/0062406 A1 | 3/2011 | Liu et al. |
| 2011/0198672 A1 | 8/2011 | Leedy |
| 2011/0287602 A1 | 11/2011 | Chang |
| 2012/0228557 A1 | 9/2012 | Shin et al. |
| 2014/0220763 A1 * | 8/2014 | Liu et al. ................. 438/455 |

FOREIGN PATENT DOCUMENTS

| | | |
|---|---|---|
| TW | 098132748 | 2/2014 |
| WO | WO 98/45130 A1 | 10/1998 |
| WO | PCT/US2009/057017 | 4/2010 |
| WO | PCT/US2009/057017 | 5/2011 |

OTHER PUBLICATIONS

Hideki Takagi, et al., "Room-Temperature Bonding of Si Wafers to Pt Films on Si02 or LiNb03 Substrates Using Ar- Beam Surface Activation" Japan Journal of Applied Physics, (Dec. 15, 1999) pp. L 1559-L 1561, vol. 38.

Prachi Patel-Predd, "Nanoglue for Electronics" Technology Review; May 23, 2007; 3 pp.

Smart Cut , Wikipedia (http://enwikipedia.org/wiki/Smart_Cut), Dec. 9, 2007, 1 p.

T. Suga, "Room Temperature Bonding/SAB and its Application in Microelectronics" Public Lecture Series: The Impact of Water-Level Technologies on Advanced IC Design, The University of Tokyo, May 24, 2001, 18 pp.

T. Suni et al., "Effects of Plasma Activation on Hydrophilic Bonding of Si and Si02" Journal of the Electrochemical Society, Apr. 25, 2002, pp. G348-G351, 149 (6).

Takao Yonehara, et al., "ELTRAN®; Novel SOI Wafer Technology", JSAP International, No. 4 (Jul. 2001) pp. 10-16.

* cited by examiner

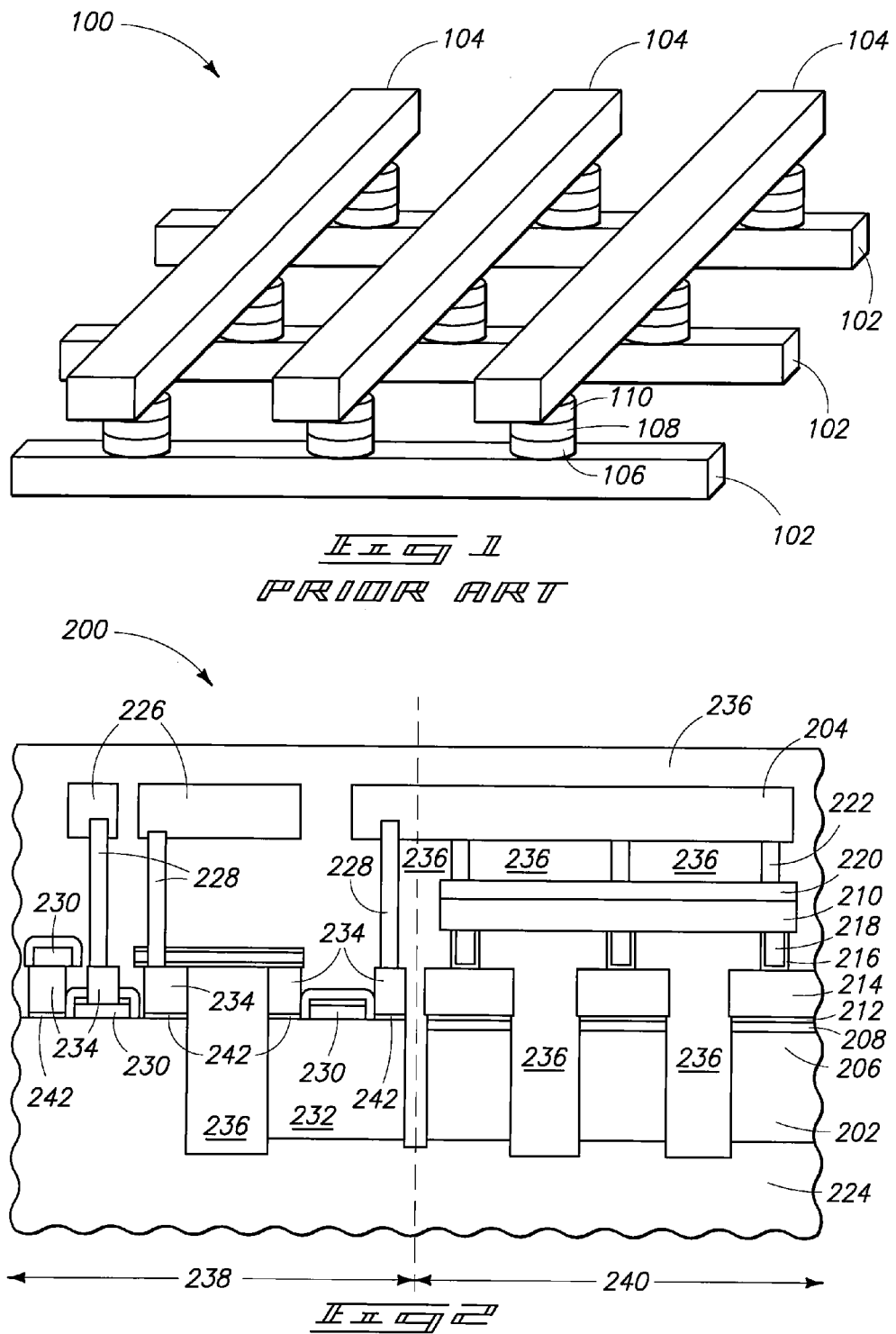

MEMORY DEVICES AND FORMATION METHODS

RELATED PATENT DATA

This application is a continuation of U.S. patent application Ser. No. 13/888,674, which was filed on May 7, 2013, which is a continuation of U.S. patent application Ser. No. 13/442,047, which was filed on Apr. 9, 2012 and is now U.S. Pat. No. 8,455,853, which is a continuation of U.S. patent application Ser. No. 12/952,047, which was filed on Nov. 22, 2010 and is now U.S. Pat. No. 8,164,081 issued on Apr. 24, 2012, which is a divisional of U.S. patent application Ser. No. 12/261,948, which was filed Oct. 30, 2008 and is now U.S. Pat. No. 7,858,468 issued on Dec. 28, 2010, and which are incorporated herein by reference.

TECHNICAL FIELD

The invention pertains to memory devices and to methods of forming diode-accessed, cross-point memory cells having a state-changeable memory element containing chalcogenide phase change material.

BACKGROUND

Known diode-accessed, cross-point memory cells may use a rectifying diode as an access device to a state-changeable memory element. The memory element may contain chalcogenide phase change material. Applying a current to the memory element may change a phase of the material so that the memory element exhibits a different resistance. The phase may also be changed back. Hence, the two resistive states provide the "on" and "off" status for data storage.

FIG. 1 shows a conceptual, perspective view of a diode-accessed, cross-point memory array and illustrates its general spatial configuration. The simplified view of FIG. 1 merely shows a memory array 100 that includes words lines 102 having a direction orthogonal to a direction of bit lines 104 and overlapping at cross-points. At cross-points, an access diode containing a n-type material 106 and a p-type material 108 is combined with a memory element 110 in an electrically-connected series extending between word line 102 and bit line 104 at the cross-point. Actual structures implementing the concept shown in FIG. 1 may be formed by a variety of known methods.

To achieve a $4F^2$ footprint, where "F" is feature size of the access diode, some known methods form n-type material 106 and p-type material 108 in a monocrystalline silicon substrate. With the rectifying diode positioned in monocrystalline silicon, a high current density may be provided to effect a phase change in the state-changeable memory element 110 when it contains chalcogenide phase change material. Other silicon-based diodes may include those formed in polysilicon.

Unfortunately, forming silicon-based diodes uses processing temperatures in excess of 400° C. For activation annealing, temperature may be from 800° C. to 1000° C. for a time of from 2 hours to 20 seconds. As a result, structures of the memory array sensitive to temperatures in excess of 400° C. are formed in advance of processing the silicon-based diodes. Although silicon-based diodes may provide a high current density, their presence also limits the materials and processing order suitable for forming the memory array. Methods and/or materials that overcome the limitations of using silicon-based diodes may be useful.

BRIEF DESCRIPTION OF THE DRAWINGS

FIG. 1 shows a conceptual, perspective view of a known memory array.

FIG. 2 shows a partial, cross-sectional view of a memory array.

DETAILED DESCRIPTION OF THE ILLUSTRATED EMBODIMENTS

Figure 3:
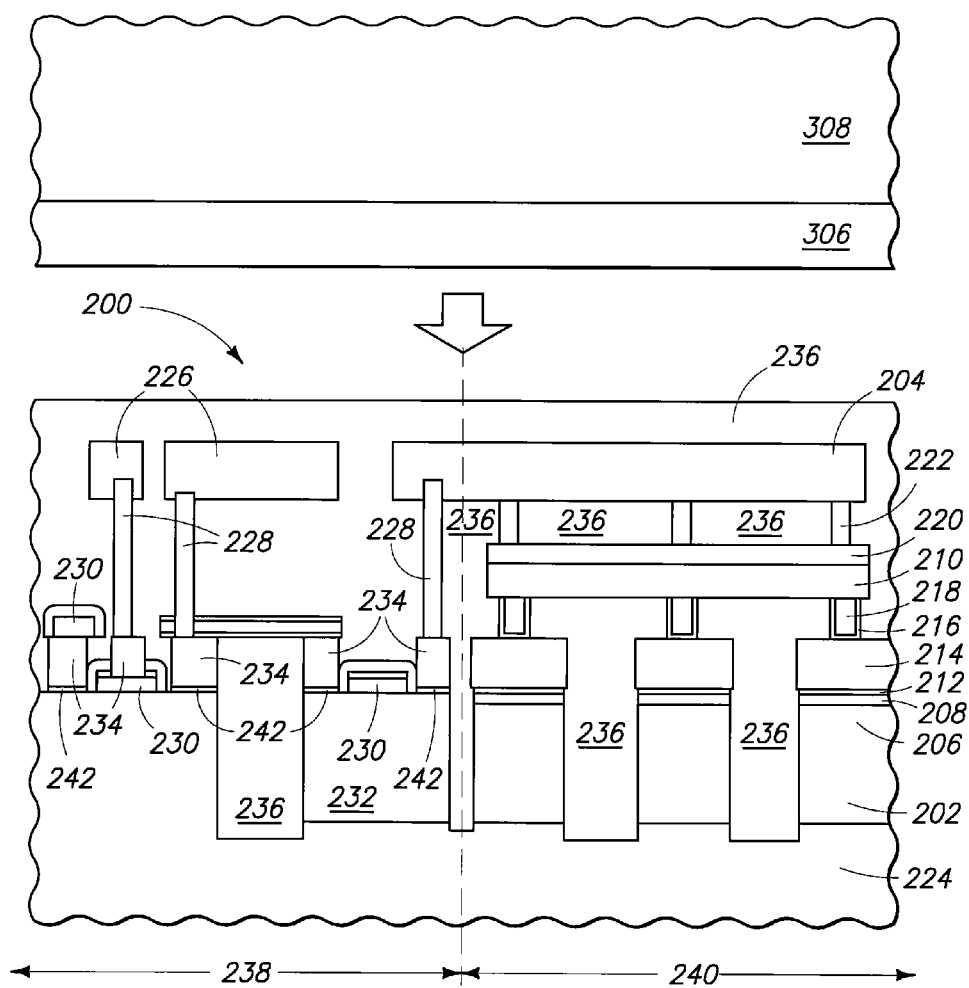
FIG. 3-5 show the memory array of FIG. 2 at a successive process steps.

FIG. 2 shows a partial, cross-sectional view of a memory level 200 that represents one example of an integrated circuit over which a diode-accessed, cross-point array of memory cells may be formed according to the embodiments described herein. A few options for an integrated circuit include a memory array, a peripheral circuit, a central processing unit (CPU), and application-specific integrated circuit (ASIC), a field-programmable gate array (FPGA), combinations thereof, etc. Notably, memory level 200 of FIG. 2 has both a peripheral region 238 including a peripheral circuit and an array region 240 including a memory array. Peripheral region 238 may include memory cell addressing circuits and memory cell read circuits and interoperate with memory cells of array region 240. As will be appreciated from the discussion below, including a peripheral circuit as the integrated circuit and forming most or all of memory devices elevationally above the integrated circuit may enable reducing die size for the overall device.

The term "peripheral" designating peripheral region 238 refers to the function of circuits in such region and does not restrict the location of peripheral region 238 with respect to array region 240. Often, an array region may be positioned at the center of a memory device with memory cell read circuits and memory cell addressing circuits located in the periphery surrounding the array region. Hence, such circuits may be termed "peripheral" but, partly as a result of improvements in modern design and processing, may be located anywhere known to be suitable within the memory devices described herein. Also, although FIG. 2 displays some detail regarding structural features of circuits in peripheral region 238, the embodiments are not restricted to such structural features. Any known memory cell read circuits, memory cell addressing circuits, and other circuits may be used in peripheral region 238 to provide an operable memory device containing memory level 200.

Without elaborating extensively on the specific structural features of circuits in peripheral region 238, it is easily observable by those of ordinary skill that a substrate 224 has openings formed therein containing insulator material 236 and forming an active area 232. Substrate 224 may include a monocrystalline semiconductor, including but not limited to monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulator material 236 may include silicon oxide, silicon nitride, silicon oxynitride, combinations thereof, etc. Plasma enhanced chemical vapor deposition may be used to form insulator material 236 using, for example, tetraethylorthosilicate (TEOS)-based methods, which may include ozone. Conductive contacts 242 may be provided between substrate 224 and conductive plugs 234. Contacts 242 may contain cobalt silicide ($CoSi_2$), and/or other materials, and plugs 234 may contain tungsten, and/or other materials. Conductive vias 228, which may contain tungsten, and/or other materials, may extend through insulator material 236 electrically connecting plugs 234 with conductive metallization 226. Metallization 226 may contain aluminum, copper, and/or other materials. While vias 228 and plugs 234 provide vertical conductive interconnections, conductive lines 230 provide horizontal conductive interconnections, shown in cross-sectional view extending into and out of the sectional plane of FIG. 2.

Turning to array region 240 of FIG. 2, individual memory cells include a word line 202, n-type material 206, p-type material 208, memory element 210, and a bit line 204 all electrically connected in series. In the embodiment of FIG. 2, word line 202, n-type material 206, and p-type material 208 are all formed in substrate 224. Among other methods, such may be accomplished by placing dopants in a common semiconductor material to provide differing conductivity types and/or dopant concentrations.

As one example, substrate 224 may exhibit p-type conductivity while the portion of substrate 224 encompassing word line 202 and n-type material 206 may exhibit n-type conductivity and be heavily doped to provide n+ material. P-type material 208 may also be heavily doped to provide p+ material. As another example, though not shown in FIG. 2, the portion of substrate 224 encompassing word line 202 may be heavily doped to provide n+ material and the portion of substrate 224 encompassing n-type material 206 may be lightly doped to provide n-material. Other known doping arrangements, materials, and/or layers may be used to provide a suitable access diode containing a p-n junction electrically connected in series with a word line and a state-changeable memory element.

In FIG. 2, a contact 212 is provided between p-type material 208 and a plug 214. Contact 212 may contain a material in common with contacts 242 and plug 214 may contain a material in common with plugs 234. Being at a common elevational level and serving similar purposes, contact 212 and plug 214 may be formed at the same time as respective contacts 242 and plugs 234. A via including a conductive liner 216 and an insulator material fill 218 may be provided electrically connecting plug 214 to memory element 210. Conductive liner 216 in the via may include titanium nitride, and/or other materials, and fill 218 may include a material in common with insulator material 236. Alternatively, the via may be formed wholly of conductive material, such as TiN or TiAlN, without any insulator material fill.

A cap 220 over memory element 210 and a via 222 electrically connect memory element 210 to bit line 204. Cap 220 may include titanium nitride, and/or other materials, and via 222 may include tungsten, and/or other materials. Memory element 210 may include a chalcogenide phase change material and spans across multiple memory cells along with cap 220. In FIG. 2, memory element 210 and cap 220 are represented as a continuous line parallel to bit line 204. Alternatively, memory element 210 and cap 220 may be isolated to individual memory cells. One example of a suitable phase change material includes germanium antimony tellurium (GST) which may exhibit a composition consisting of $Ge_xSb_yTe_z$, where x, y, and z may be within ranges known to provide the desired state-changeable properties.

As may be appreciated from the discussion herein and FIGS. 1-2, the memory array in array region 240 implements the concept of diode-accessed, cross-point memory shown in FIG. 1. The memory structure shown fits within a broader category of memory known as resistive random access memory (RRAM), which includes another category of memory known as phase change random access memory (PCRAM) also encompassing the shown memory structure. Bit line 204 extends in a direction orthogonal to word line 202 in a manner similar to that shown for bit line 104 and word line 102 in FIG. 1, with word line 202 shown in cross-sectional view extending into and out of the sectional plane of FIG. 2. As such, bit line 204 and word line 202 overlap at a cross-point. The access diode, containing n-type material 206 and p-type material 208, and memory element 210 extend between word line 202 and bit line 204 at the cross-point. Although word line 202 and bit line 204 are shown extending in directions orthogonal to one another, it will be appreciated that embodiments herein encompass bit lines and word lines overlapping at cross-points though not extending in orthogonal directions.

As indicated, forming silicon-based diodes may use processing temperatures in excess of 400° C. In FIG. 2, n-type material 206 and p-type material 208 are positioned at an elevational level below other components, such as the metal-containing interconnects and memory element 210 that might be damaged by such processing temperatures. With the access diode at a low elevational level, silicon-based diode processing temperatures may be applied without risk to later-formed components at higher elevational levels.

Observation indicates that diode-based, cross-point memory cells might be suitable for a three-dimensional architecture except for the susceptibility of integrated circuits, such as those shown in FIG. 2, to process conditions, such as processing temperatures, that may be used in forming subsequent memory levels. However, if the levels are stacked and bonded together as in the embodiments herein, a stacked, three-dimensional architecture may be used to reduce damage to underlying components. That is, components formed using process conditions potentially damaging to underlying components may be formed first followed by bonding over memory level 200, or other integrated circuits. It follows that bonding methods may be used that also reduce exposure to potentially damaging process conditions. Appropriate conductive interconnections may be made between the underlying integrated circuit and a subsequent memory level(s) bonded thereover, if desired.

In one embodiment, a method includes providing an integrated circuit having a metal-containing conductive interconnect and forming an electrical insulator material over the integrated circuit. The method also includes providing a substrate containing a semiconductor material exhibiting a first conductivity type and placing a dopant in only a portion of the semiconductor material. The dopant may be activated to provide a doped region containing the activated dopant. The doped region exhibits a second conductivity type opposite the first conductivity type and the doped region provides a junction with a portion of the semiconductor material still exhibiting the first conductivity type. After activating the dopant, the method includes bonding the substrate to the insulator material and removing at least some of the substrate where bonded to the insulator material to expose at least some of the underlying insulator material. After the removing, a memory cell is formed having a word line, an access diode, a state-changeable memory element containing chalcogenide phase change material, and a bit line all electrically connected in series. The access diode contains the junction as a p-n junction. The bit line and the word line overlap at a cross-point and the access diode and the memory element extend between the word line and the bit line at the cross-point.

By way of example, the metal-containing conductive interconnect may exhibit properties such that, if exposed to at least one operating condition used in the activating, a physical structure of the interconnect would be altered. The activating of the dopant in the substrate may occur apart from the integrated circuit. Thereby, exposure of the metal-containing conductive interconnect to operating conditions used in activating the dopant may be diminished. The activating of the dopant may include heating to a temperature greater than 400° C.

The integrated circuit might include other components, such as chalcogenide phase change material, susceptible to at least one operating condition used in the activating of the dopant. That is, providing the integrated circuit may include forming another memory cell having another word line, another access diode, another state-changeable memory element containing the chalcogenide phase change material, and another bit line all electrically connected in series. The other bit line and the other word line may overlap at another cross-point and the other access diode and other memory element may extend between the other word line and the other bit line at the other cross-point. A method so applied may thus provide two memory levels of diode-based, cross-point memory cells in a three-dimensional, stacked architecture.

The semiconductor material may contain a monocrystalline material and the p-n junction may lie within the monocrystalline material. The first conductivity type may be p-type and the second conductivity type may be n-type. Providing the substrate might include providing a monocrystalline silicon substrate exhibiting p-type conductivity as the semiconductor material.

A variety of known bonding methods may be relied on, for example, those in which the bonding may occur at no higher than 400° C. The doped region of the substrate may be bonded to the insulator material. The bonding may include bonding the substrate directly to the insulator material. Alternatively, the bonding may include providing an adhesion material between the substrate and the insulator material.

Figure 4:
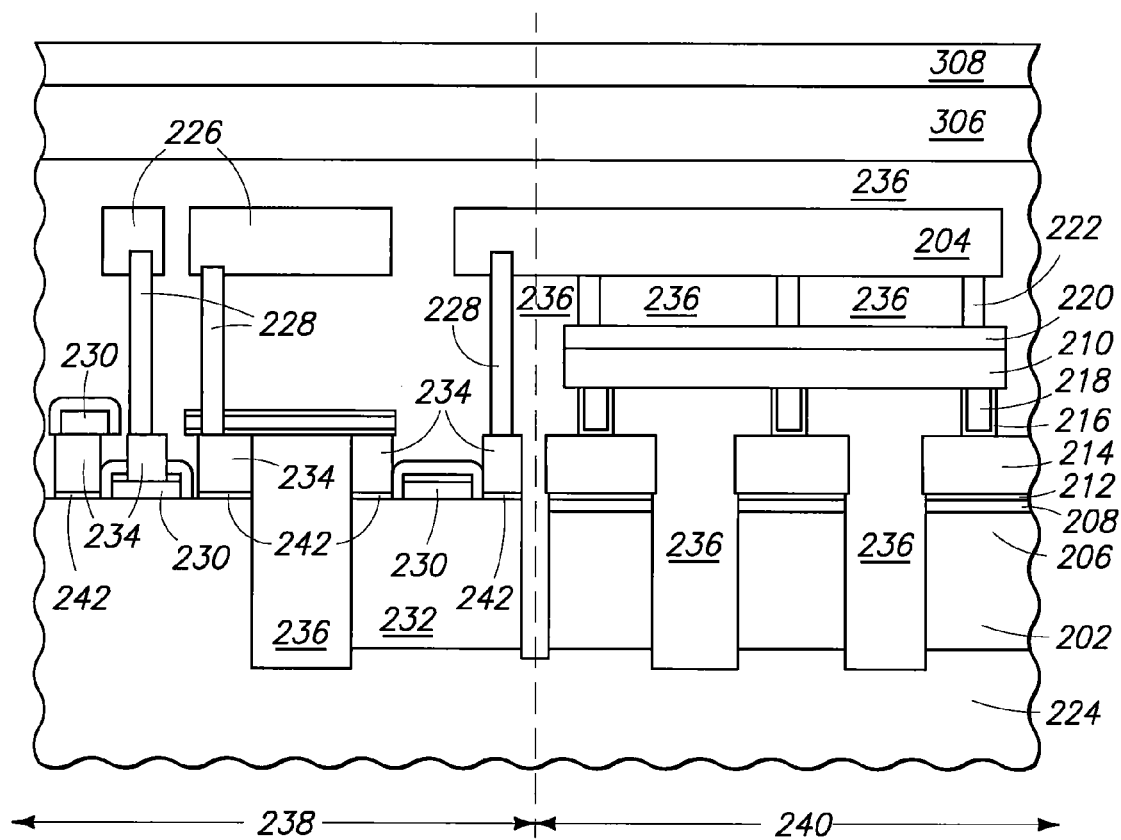

FIG. 3 shows a substrate containing n-type material 306 and p-type material 308 being applied over insulator material 236 of memory level 200. The integrated circuit encompassing devices formed in array region 240 and peripheral region 238 may occupy, but not extend beyond, a lateral extent of the integrated circuit. The bonding may include forming a bond interface between the substrate and the insulator material, wherein the bond interface is continuous and substantially planar over a lateral extent. Although not shown, an adhesion material may be included. FIG. 4 shows a bond interface that is continuous and substantially planer over the lateral extent within the partial view provided.

FIG. 4 also shows part of p-type material 308 removed. Excess p-type material 308 may be removed using any known the method compatible with methods described herein and structures formed thereby. Chemical-mechanical polishing (CMP), wet etching, dry etching, etc. are among the possibilities. However, it is conceivable to prepare the substrate containing n-type material 306 and p-type material 308 in advance so that excess material may be more easily removed after bonding.

Figure 7:
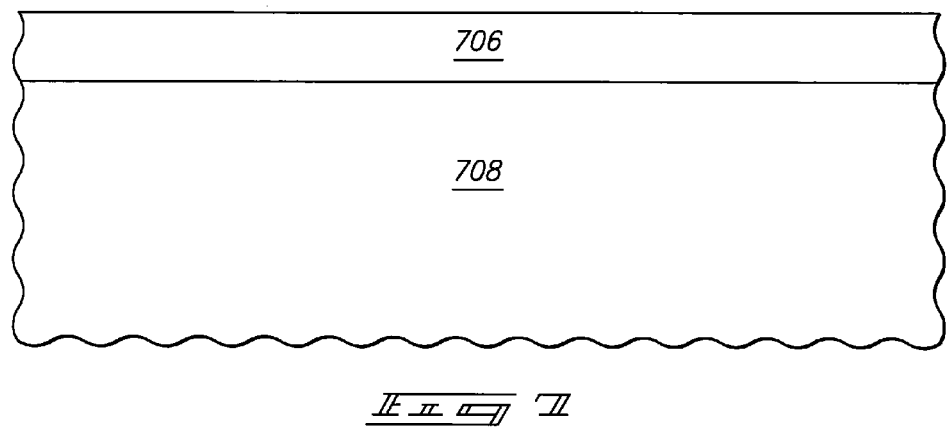
FIGS. 7-8 show partial, cross-sectional views of a substrate containing a semiconductor material at successive process steps.
Figure 8:
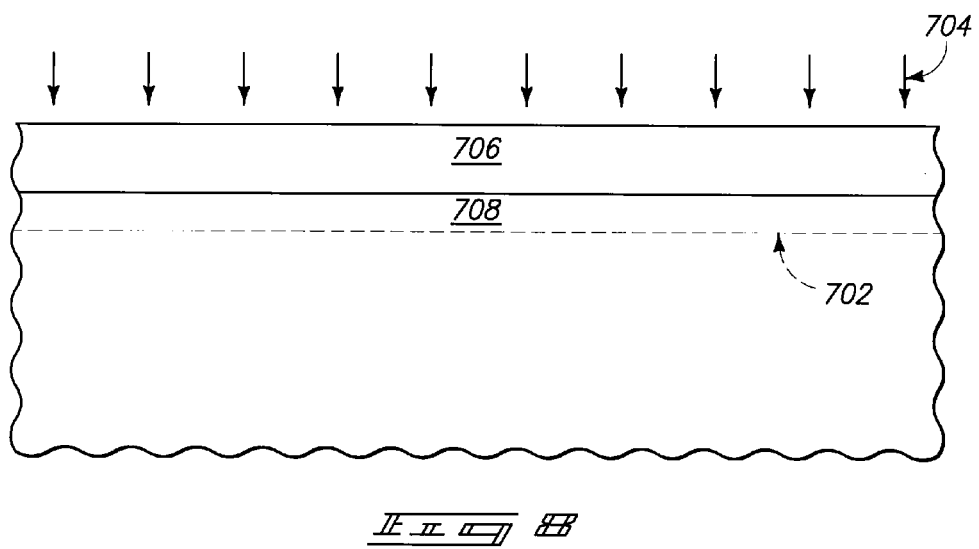

FIGS. 7-8 show abbreviated details of a known method identified as the SMART-CUT process used by SOITEC of Benin, France and is one example of a method that involves implanting ions into a wafer and bonding a silicon layer to a substrate by thermal treatment. The SMART-CUT process is described in A. J. Auberton-Herve, "SOI Materials to Systems," Digest of the International Electron Device Meeting, San Francisco, pg. 3-10, December 1996. Even though the SMART-CUT process is known for bonding an oxidized silicon adhesion layer to a silicon wafer, such method may be modified to be of use in accomplishing the embodiments described herein.

For example, FIG. 7 shows a substrate including a n-type material 706 and p-type material 708. In FIG. 8, hydrogen ions 704 are implanted in p-type material 708 to form a defect material 702. Hydrogen ions may be implanted to a concentration of from $1\times10^{16}$ to $5\times10^{16}$ per square centimeter. Following activation of n-type and p-type dopants, n-type material 706 may be bonded to insulator material 236 directly or to an adhesion material over insulator material 236 in accordance with known processing. Thereafter, excess p-type material 708 may be broken away at defect material 702 to provide the structure shown in FIG. 4. After CMP to remove remainders of defect material 702 and possibly reduce thickness of remaining p-type material 708, formation of memory cells may proceed.

Figure 9:
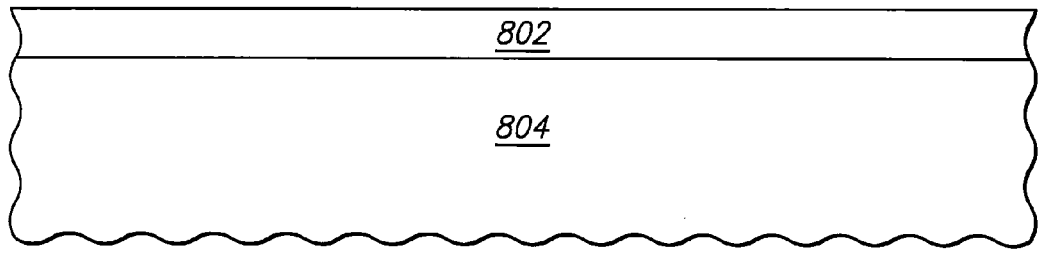
FIGS. 9-10 show partial, cross-sectional views of another substrate containing a semiconductor material at successive process steps.
Figure 10:
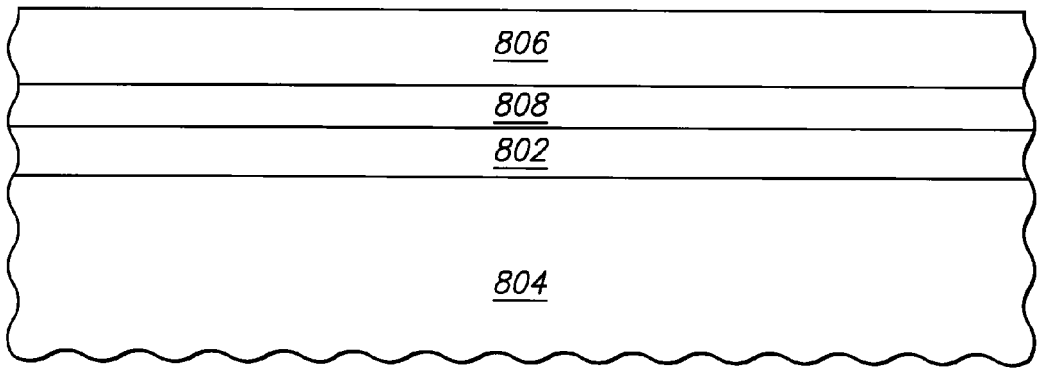

FIGS. 9-10 show abbreviated details of a known method identified as the ELTRAN (Epitaxial Layer TRANsfer) process used by Canon Inc. of Kanagawa, Japan. The ELTRAN process is described in Yonehara et al., "ELTRAN; Novel SOI Wafer Technology," JSAP Int'l, No. 4, pg. 10-16, July 2001. In FIG. 9, a portion of a substrate 804 is processed to provide a porous material 802. In the case of a silicon substrate, formation of porous material 802 may be accomplished by electrochemical reaction in HF. Even though material 802 is porous, additional semiconductor material, such as silicon, may be epitaxially grown to provide an additional thickness over porous material 802.

Either by their intrinsic properties or by placing dopants, n-type material 806 and p-type material 808 may be provided over porous material 802 as shown in FIG. 10. Following any activation of dopants, n-type material 806 may be bonded to insulator material 236 directly or to an adhesion material over insulator material 236 in accordance with known processing. Thereafter, substrate 804 along with some of porous material 802 may be broken away at porous material 802 to provide a structure like that shown in FIG. 4. Often a water jet may be used to assist in the removal. After CMP to remove remainders of porous material 802 and possibly reduce thickness of p-type material 808, formation of memory cells may proceed.

Bonding of n-type material 706 in a substrate as shown in FIG. 7, n-type material 806 in a substrate as shown in FIG. 10, or other substrates may also be accomplished by plasma enhanced bonding such as described in Suni et al., "Effects of Plasma Activation on Hydrophilic Bonding of Si and $SiO_2$," J. Electrochem Soc., Vol. 149, No. 6, pg. G348-51, June 2002. That is, low-pressure argon or oxygen plasma may be used to activate a surface of n-type material 706 to be bonded. Such activation promotes hydrophilic bonding, such as Si to $SiO_2$ bonding, at temperatures below 200° C.

In a related known method, surfaces to be bonded may be sputter-cleaned by means of energetic particle bombardment and brought into contact under slight applied pressure in a vacuum environment.

Also, it is possible to use an argon beam to activate a surface to facilitate bonding between platinum and silicon at room temperature as described in Takagi et al., "Room-Temperature Bonding of Si Wafers to Pt Films on SiO$_2$ or LiNbO$_3$ Substrates Using Ar-Beam Surface Activation," Jpn. J. Appl. Phys., Vol. 38, Part 2, No. 12B, pg. 1559-61, December 1999. Platinum might be deposited on insulator material 236 as an adhesion material.

Another low temperature bonding method includes surface activated bonding (SAB) involving deposition of metal films on both a silicon substrate and a SiO$_2$ substrate as described in T. Suga, "Room Temperature Bonding/SAB and Its Applications in Microelectronics," Public Lecture Series: The Impact of Wafer-Level Technologies on Advanced IC Design, Stanford University, pg. 1-18, May 24, 2001. Possible pairs of metals for use in the two films includes Cu—Cu, Al—Ti, Ni—Cu, and Al—Cu. Elevated temperature exposure up to about 450° C. may facilitate bonding, though, the upper end of the range is noted as exceeding 400° C. at which temperature structure alteration might begin to occur in exposed metal-containing interconnects and/or phase change material.

An organic "nanoglue" may also be used for bonding as discussed in "Nanoglue for Electronics," Technology Review, Massachusetts Institute of Technology, May 23, 2007. Essentially, a chain of carbon and hydrogen atoms with sulfur at one end and silicon at the other end may respectively hold copper and SiO$_2$ together. The molecules orient themselves next to each other and adhesive strength increases at temperatures up to 700° C. An expectation exists that nanoglue might be tailored to adhere different materials by attaching appropriate chemical groups at the two ends of the molecular chain. Dissimilar materials, such as insulators and semiconductors, or metals and semiconductors, may be bonded.

In the bonding shown in FIGS. 3-4, insulator material 236 may be silicon dioxide. Consequently, copper may be formed on the substrate including n-type material 306 and the nanoglue used as described in the "Nanoglue" reference to bond copper to silicon dioxide. The copper may be blanket deposited across all of n-type material 306 and/or formed in a manner that provides patterned copper.

U.S. Pat. No. 6,563,133 issued to Tong pertains to a method of epitaxial-like wafer bonding at low temperature. The method involves bonding oxide-free silicon substrate pairs and other substrates at low temperature by modifying the surfaces to create defect regions. For example, plasma treatment of the surfaces to be bonded with boron-containing plasmas or surface defect regions created by ion implantation, preferably using boron, may prepare the surfaces. The surfaces may also be amorphized. Placing the treated surfaces together forms an attached pair at room temperature in ambient air. Such a method may be useful in embodiments described herein.

Following bonding, p-type material 308 shown in FIG. 4 may be processed to provide a suitable thickness. Patterning through p-type material 308 and n-type material 306 using known methods may provide word line 502, n-type material 506, and p-type material 508 shown in FIG. 5. An example of one known method includes standard photolithography and dry etching. As will be appreciated from FIG. 5, the removal of at least some of n-type material 306 and p-type material 308 where bonded to insulator material 236 may expose at least some of the underlying insulator material 236, or other underlying material, if present.

A variety of options exist for processing adhesion material, if provided, between n-type material 306 and insulator material 236. If the adhesion material is insulative, then it may remain or be removed during removal of some of n-type material 306 and p-type material 308 to form word line 502. When the adhesion material is insulative, it provides additional insulator material between n-type material 306 and insulator material 236. If the adhesion material remains, then the insulator material exposed upon removal of some of n-type material 306 will be the insulator material of the adhesion material. Otherwise, if the adhesion material is removed, then the insulator material exposed during processing will be insulator material 236. If the adhesion material is conductive, then it may be removed to reduce shorting between word lines, such as word lines 502.

In either circumstance of insulative or conductive adhesion material, the adhesion material may be patterned prior to bonding the substrate to insulator material 236. As one possibility, removing at least some of n-type material 306 and exposing underlying insulator material 236 might not involve removing adhesion material. Such is especially the case if the earlier patterning of the adhesion material matches the later patterning of word lines 502.

In the event that conductive adhesion material remains between word lines 502 and insulator material 236, such conductive material may provide conductive strapping of word lines 502 in accordance with known strapping techniques. Strapping may enhance conductivity of word lines 502. In this manner, the method may include forming conductive lines over insulator material 236 between the substrate and insulator material 236. Notably, adhesion material used in the bonding methods herein may be formed on the substrate containing n-type material 306, on insulator material 236, or both. Hence, patterning of adhesion material, such as to form conductive lines, may occur on the substrate containing n-type material 306, on insulator material 236, or both.

Figure 5:
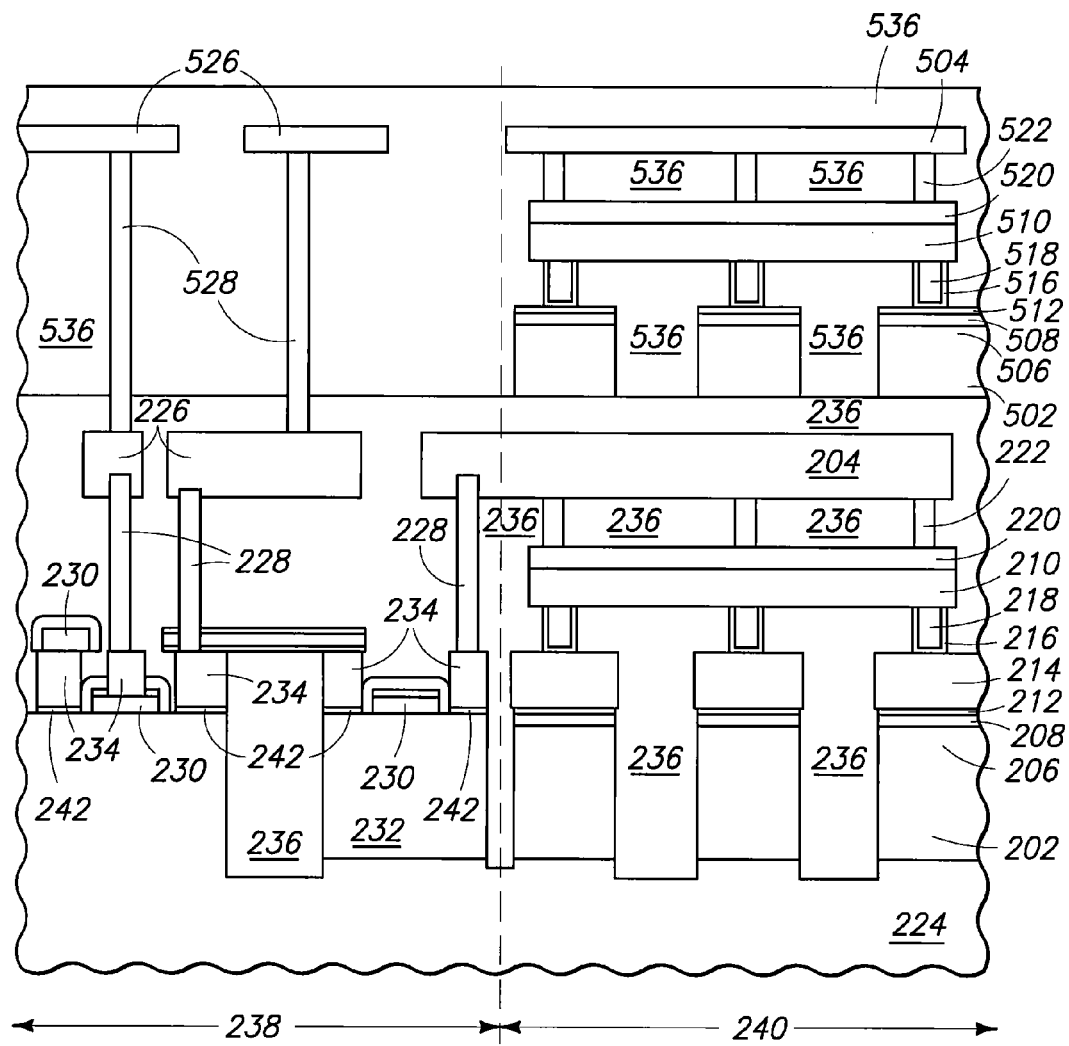

As will be appreciated from FIG. 5, forming the memory cell containing word line 502 includes forming the access diode above the word line, forming the memory elements above the access diode, and forming the bit line above the memory element. Word line 502, n-type material 506, and p-type material 508 are all formed in n-type material 306 and p-type material 308 from FIG. 4. N-type material 506 and p-type material 508 provide a p-n junction for the access diode. The various conductivity types and/or dopant concentrations described above for the access diode in memory level 200 are also applicable to the additional access diode formed thereover in FIG. 5. As described, dopants may be activated before bonding the substrate containing n-type material 306 to insulator material 236. Consequently, the bonded substrate may provide n+/n+/p+, n+/n−/p+, n+/n+/p, or n+/n−/p doped semiconductor material to become the respective word line 502/n-type material 506/p-type material 508.

In accordance with known methods and structures, a contact 512 is provided on and in contact with p-type material 508. A via including a conductive liner 516 and an insulator material fill 518 may be provided electrically connecting contact 512 to memory element 510. Alternatively, the via may be formed wholly of conductive material without any insulator material fill. A cap 520 over memory element 510 and a via 522 electrically connect memory element 510 to bit line 504. An insulator material 536 may be provided over and around the describe components. In FIG. 5, memory element 510 and cap 520 are represented as a continuous line parallel to bit line 504. Alternatively, memory element 510 and cap 520 may be isolated to individual memory cells. Composition of the components shown in FIG. 5 may be selected from among the same materials as described for like components of memory level 200.

Metallization 526 and vias 528 may be provided electrically interconnecting the added array of memory cells to underlying devices in peripheral region 238 of memory level 200. As a result, the memory cell addressing circuits and memory cell read circuits of memory level 200 may interoperate with memory cells of the array added over memory level 200. Alternatively, additional memory cell addressing circuits and memory cell read circuits may be provided over memory level 200 to separately interoperate with the additional memory cells.

Figure 6:
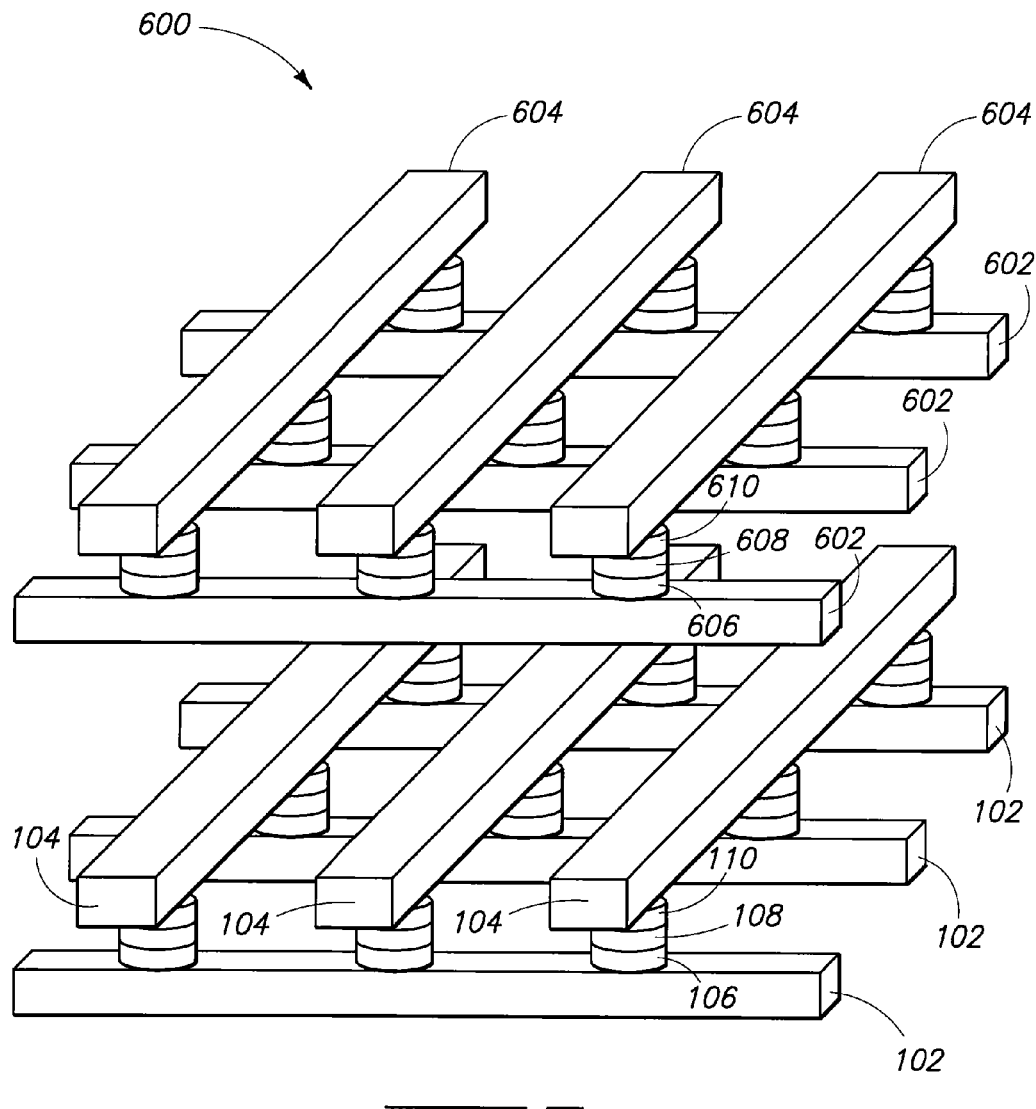
FIG. 6 shows a conceptual, perspective view of the FIG. 5 memory array.

The added array of memory cells consequently implements the concept of diode-accessed, cross-point memory in a three-dimensional stacked architecture. FIG. 6 shows a conceptual, perspective view of the stacked architecture. The simplified view of FIG. 6 merely adds a memory array 600 that includes word lines 602 having a direction orthogonal to a direction of bit line 604 and overlapping at cross-points. At cross-points, an access diode containing a n-type material 606 and a p-type material 608 is combined with a memory element 610 in an electrically-connected series extending between word line 602 and bit line 604 at the cross-point. Although two memory levels are shown in FIG. 6, it will be appreciated that additional memory levels could be added and interoperate, or not interoperate, as described herein for the first two levels.

In one embodiment, a method includes forming an integrated circuit including forming a first memory cell having a first word line, a first access diode, a first state-changeable memory element containing chalcogenide phase change material, and a first bit line all electrically connected in series. The bit line and the word line overlap at a cross-point, the access diode and memory element extend between the word line and the bit line at the first cross-point, and the first memory cell also has a metal-containing conductive interconnect. An electrical insulator material is formed over the integrated circuit.

The method includes providing a substrate containing a semiconductor material exhibiting a first conductivity type, placing a dopant in only a portion of the semiconductor material, and activating the dopant apart from the integrated circuit to provide a doped region containing the activated dopant. The doped region exhibits a second conductivity type opposite the first conductivity type. The doped region provides a junction with a portion of the semiconductor material still exhibiting the first conductivity type. After activating the dopant, the method includes bonding the substrate to the insulator material. The interconnect and the first memory element exhibit properties such that, if exposed to at least one operating condition used in the activating, physical structures of the interconnect and the first memory element would be altered. At least some of the substrate is removed where bonded to the insulator material to expose at least some of the underlying insulator material.

After the removing, the method includes forming a second memory cell having a second word line, a second access diode, a second state-changeable memory element containing chalcogenide phase change material, and a second bit line all electrically connected in series. The second access diode contains the junction as a p-n junction, the second bit line and the second word line overlap at a second cross-point, and the second access diode and second memory element extending between the second word line and the second bit line at the second cross-point.

By way of example, the semiconductor material may be a monocrystalline material, the first conductivity type may be p-type, the second conductivity type may be n-type, and the p-n junction may lay within the monocrystalline material. Also, the bonding may include bonding the doped region of the substrate to the insulator material at no higher than 400° C. The integrated circuit may occupy, but not extend beyond, a lateral extent of the integrated circuit and the bonding may include forming a bond interface between the substrate and the insulator material, the bond interface being continuous and substantially planar over the lateral extent.

In one embodiment, a method includes providing an integrated circuit having a metal-containing conductive interconnect and forming an electrical insulator material over the integrated circuit. The method includes providing a substrate containing a semiconductor material exhibiting p-type conductivity, placing a dopant in only a portion of the semiconductor material, and activating the dopant apart from the integrated circuit by heating to greater than 400° C. to provide a doped region containing the activated dopant. The doped region exhibits n-type conductivity and the doped region provides a p-n junction with a portion of the semiconductor material still exhibiting p-type conductivity. After activating the dopant, the n-type doped region of the substrate is bonded to the insulator material at no higher than 400° C. At least some of the substrate is removed where bonded to the insulator material to expose at least some of the underlying insulator material After the removing, the method includes forming a memory cell having a word line, an access diode, a state-changeable memory element containing chalcogenide phase change material, and a bit line all electrically connected in series. The access diode contains the p-n junction, the bit line and the word line overlap at a cross-point, and the access diode and memory element extend between the word line and the bit line at the cross-point.

In addition to methods, embodiments also address memory devices. In one embodiment, a memory device includes an integrated circuit having a metal-containing conductive interconnect and an electrical insulator material over the integrated circuit. The memory device includes a memory cell having a word line, an access diode above the word line, a state-changeable memory element above the access diode and containing chalcogenide phase change material, and a bit line above the memory element all electrically connected in series. The access diode contains a p-n junction in a semiconductor material, the bit line and the word line overlapping at a cross-point and the access diode and memory element extending between the word line and the bit line at the cross-point. An adhesion material is over the insulator material and bonds the word line to the insulator material.

By way of example, the integrated circuit may include a structure selected from the group consisting of a memory array, a peripheral circuit, a central processing unit, an application-specific integrated circuit, a field-programmable gate array, and combinations thereof. The integrated circuit may include a peripheral circuit configured to operate the memory cell formed thereover. The adhesion material may include one or more metal films, an organic nanoglue, or combinations thereof.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a multi-level integrated circuit, comprising:
   forming circuit components onto a first substrate, the circuit components of the first substrate comprising a metal-containing conductive interconnect;
   forming an electrical insulator material over the circuit components of the first substrate;
   processing a second substrate to comprise first conductivity type semiconductor material having a dopant in only a portion thereof;
   activating the dopant to form a doped region that contains the activated dopant, the doped region exhibiting second conductivity type opposite the first conductivity type and forming a junction with a portion of the semiconductor material still exhibiting the first conductivity type;
   after activating the dopant, bonding the second substrate to the insulator material of the first substrate;
   removing at least some material of the second substrate where bonded to the insulator material to expose at least some of the underlying insulator material; and
   after the removing, forming a plurality of cross-point memory cells within the second substrate, the forming of the plurality of cross-point memory cells comprising patterning through the doped region of the second substrate to form a plurality of conductive lines of the cross-point memory cells, the plurality of conductive lines comprising the doped region exhibiting the second conductivity type.

2. The method of claim 1 wherein the insulator material is selected from the group consisting of silicon oxide, silicon nitride, silicon oxynitride, and combinations thereof.

3. The method of claim 1 wherein the semiconductor material comprises a monocrystalline material.

4. The method of claim 1 wherein the bonding comprises providing an adhesion material between the second substrate and the insulator material of the first substrate.

5. The method of claim 4 wherein the adhesion material is electrically insulative.

6. The method of claim 1 wherein the bonding occurs at no higher than 400° C.

7. A method of forming a multi-level integrated circuit, comprising:
   forming circuit components onto a first substrate, the circuit components of the first substrate comprising a metal-containing conductive interconnect;
   forming an electrical insulator material over the circuit components of the first substrate;
   processing a second substrate to comprise first conductivity type semiconductor material having a dopant in only a portion thereof;
   activating the dopant to form a doped region that contains the activated dopant, the doped region exhibiting second conductivity type opposite the first conductivity type and forming a junction with a portion of the semiconductor material still exhibiting the first conductivity type;
   after activating the dopant, bonding the second substrate to the insulator material of the first substrate;
   removing at least some material of the second substrate where bonded to the insulator material to expose at least some of the underlying insulator material;
   after the removing, forming a plurality of cross-point memory cells within the second substrate; and
   the interconnect exhibiting a property such that, if exposed to at least one operating condition used in the activating, a physical structure of the interconnect would be altered.

8. The method of claim 7 wherein the at least one operating condition is temperature greater than 400° C., the activating comprising heating to greater than 400° C.

9. A method of forming a multi-level integrated circuit, comprising:
   forming circuit components onto a first substrate, the circuit components of the first substrate comprising a metal-containing conductive interconnect;
   forming an electrical insulator material over the circuit components of the first substrate;
   processing a second substrate to comprise first conductivity type semiconductor material having a dopant in only a portion thereof;
   activating the dopant to form a doped region that contains the activated dopant, the doped region exhibiting second conductivity type opposite the first conductivity type and forming a junction with a portion of the semiconductor material still exhibiting the first conductivity type;
   after activating the dopant, bonding the second substrate to the insulator material of the first substrate, the bonding comprising bonding the doped region to the insulator material;
   removing at least some material of the second substrate where bonded to the insulator material to expose at least some of the underlying insulator material; and
   after the removing, forming a plurality of cross-point memory cells within the second substrate.

10. A method of forming a multi-level integrated circuit, comprising:
    forming circuit components onto a first substrate, the circuit components of the first substrate comprising a metal-containing conductive interconnect;
    forming an electrical insulator material over the circuit components of the first substrate;
    processing a second substrate to comprise first conductivity type semiconductor material having a dopant in only a portion thereof;
    activating the dopant to form a doped region that contains the activated dopant, the doped region exhibiting second conductivity type opposite the first conductivity type and forming a junction with a portion of the semiconductor material still exhibiting the first conductivity type;
    after activating the dopant, bonding the second substrate to the insulator material of the first substrate, the bonding comprising bonding the second substrate directly to the insulator material of the first substrate;
    removing at least some material of the second substrate where bonded to the insulator material to expose at least some of the underlying insulator material; and
    after the removing, forming a plurality of cross-point memory cells within the second substrate.

11. A method of forming a multi-level integrated circuit, comprising:
    forming circuit components onto a first substrate, the circuit components of the first substrate comprising a metal-containing conductive interconnect;
    forming an electrical insulator material over the circuit components of the first substrate;
    processing a second substrate to comprise first conductivity type semiconductor material having a dopant in only a portion thereof;

activating the dopant to form a doped region that contains the activated dopant, the doped region exhibiting second conductivity type opposite the first conductivity type and forming a junction with a portion of the semiconductor material still exhibiting the first conductivity type;

after activating the dopant, bonding the second substrate to the insulator material of the first substrate, the bonding comprising providing an adhesion material between the second substrate and the insulator material of the first substrate, the adhesion material being electrically conductive;

removing at least some material of the second substrate where bonded to the insulator material to expose at least some of the underlying insulator material; and after the removing, forming a plurality of cross-point memory cells within the second substrate.

12. A method of forming a multi-level integrated circuit, comprising:

forming circuit components onto a first substrate, the circuit components of the first substrate comprising a metal-containing conductive interconnect;

forming an electrical insulator material over the circuit components of the first substrate;

processing a second substrate to comprise first conductivity type semiconductor material having a dopant in only a portion thereof;

activating the dopant to form a doped region that contains the activated dopant, the doped region exhibiting second conductivity type opposite the first conductivity type and forming a junction with a portion of the semiconductor material still exhibiting the first conductivity type;

after activating the dopant, bonding the second substrate to the insulator material of the first substrate, the bonding comprising forming a bond interface between the second substrate and the insulator material of the first substrate, the bond interface being continuous and substantially planar;

removing at least some material of the second substrate where bonded to the insulator material to expose at least some of the underlying insulator material; and after the removing, forming a plurality of cross-point memory cells within the second substrate.

13. A method of forming a multilevel integrated circuit, comprising:

forming circuit components onto a first substrate;

forming an electrical insulator material over the circuit components of the first substrate;

processing a second substrate to comprise first conductivity type semiconductor material having a dopant in only a portion thereof;

activating the dopant by heating to greater than 400° C. to form a doped region that contains the activated dopant, the doped region exhibiting second conductivity type opposite the first conductivity type and forming a junction with a portion of the semiconductor material still exhibiting the first conductivity type;

after activating the dopant, bonding the second substrate to the insulator material of the first substrate at no higher than 400° C.;

removing at least some material of the second substrate where bonded to the insulator material to expose at least some of the underlying insulator material; and after the removing, forming a plurality of cross-point memory cells within the second substrate, the forming of the plurality of cross-point memory cells comprising patterning through the doped region of the second substrate to form a plurality of conductive lines of the cross-point memory cells, the plurality of conductive lines comprising the doped region exhibiting the second conductivity type.

14. The method of claim 13 wherein the bonding comprises forming a bond interface between the second substrate and the insulator material of the first substrate, the bond interface being continuous and substantially planar.

15. A method of forming a multi-level integrated circuit, comprising:

forming circuit components onto a first substrate;

forming an electrical insulator material over the circuit components of the first substrate;

processing a second substrate to comprise semiconductor material having a dopant therein;

activating the dopant within the semiconductor material of the second substrate;

after activating the dopant, bonding the second substrate to the insulator material of the first substrate;

after the bonding, forming circuit components in the second substrate that comprise the activated dopant within the semiconductor material of the second substrate; and a circuit component of the first substrate exhibiting a property such that, if exposed to at least one operating condition used in the activating, a physical structure of said circuit component of the first substrate would be altered.

16. The method of claim 15 wherein the at least one operating condition is temperature greater than 400° C., the activating comprising heating to greater than 400° C.

17. A method of forming a multi-level integrated circuit, comprising:

forming circuit components onto a first substrate;

forming an electrical insulator material over the circuit components of the first substrate;

processing a second substrate to comprise semiconductor material having a dopant therein;

activating the dopant within the semiconductor material of the second substrate;

after activating the dopant, bonding the second substrate to the insulator material of the first substrate, the bonding comprising providing an electrically conductive adhesion material between the second substrate and the insulator material of the first substrate; and after the bonding, forming circuit components in the second substrate that comprise the activated dopant within the semiconductor material of the second substrate.

* * * * *